United States Patent [19]
Schade, Jr.
[11] 4,263,519
[45] Apr. 21, 1981

[54] BANDGAP REFERENCE

[75] Inventor: Otto H. Schade, Jr., North Caldwell, N.J.
[73] Assignee: RCA Corporation, New York, N.Y.

[21] Appl. No.: 52,734
[22] Filed: Jun. 28, 1979
[51] Int. Cl.[3] ..................... H03K 3/01; H01L 31/00; G05F 1/40
[52] U.S. Cl. ..................... 307/297; 307/310; 323/314; 330/261
[58] Field of Search ............... 307/310, 297, 254, 304; 330/260, 261; 323/1, 4, 16, 22 T, 25

[56] References Cited

U.S. PATENT DOCUMENTS

| | | | |
|---|---|---|---|
| 3,887,863 | 6/1975 | Brokaw | 323/22 T |
| 3,976,896 | 8/1976 | Ryder | 307/297 |
| 4,068,134 | 1/1978 | Tobey, Jr. et al. | 307/297 |
| 4,071,813 | 1/1978 | Dobkin | 307/310 |
| 4,087,758 | 5/1978 | Hareyama | 330/261 |

*Primary Examiner*—Stanley D. Miller, Jr.
*Assistant Examiner*—B. P. Davis
*Attorney, Agent, or Firm*—P. J. Rasmussen; J. S. Tripoli; E. P. Herrmann

[57] ABSTRACT

A voltage reference circuit that can use the parasitic bipolar transistors formed by the drain regions, p-well and monolithic substrate of CMOS integrated circuits. First and second common-collector amplifier transistors are arranged to maintain their base-emitter junction current densities in a prescribed ratio. The difference in current density creates a difference in base-emitter potential used to generate a current having a positive temperature coefficient. This current conducted in a resistor connected to the emitter of the first transistor generates a potential having a positive temperature coefficient. The potential across the first resistor in the emitter circuit of the first transistor is summed with the base-emitter potential of the first transistor producing a reference voltage substantially independent of temperature.

8 Claims, 5 Drawing Figures

BANDGAP REFERENCE

This invention relates to circuits for generating a reference voltage and in particular to a reference voltage circuit suitable for fabrication on CMOS integrated circuits.

Integrated reference voltage circuits having relatively small temperature coefficients have been difficult to realize in MOS circuitry. Typically designers have tended to develop reference voltages dependent upon and directly related to the threshold potential of the MOS transistors used. This involves attempts to match or proportion currents to relatively exact proportions in order to successfully predict the resultant voltage.

Other reference voltage circuits compare the gate-to-channel potential barrier characteristics of substantially identical devices designed to exhibit substantially different gate-to-channel characteristics when conditioned to conduct like currents. This type of circuit is susceptible to errors in generating the currents conducted in the comparator transistor.

For examples of the aforementioned types of references see U.S. Pat. No. 4,100,437 issued to M. E. Hoff, Jr. and U.S. Pat. No. 4,068,134 issued to M. C. Tahey, et al.

In general MOS reference voltage circuits are susceptible to fabrication errors due to difficulty in precisely defining MOS transistor channel areas and the gate parameters..

In contrast reference voltage circuits used in bipolar integrated circuits have proven to be substantially fabrication or processing-independent. Typically such devices depend upon the potential difference generated by pn junctions having similar diffusion profiles but conducting different current densities. This potential difference is used to develop a current which is directed through a resistor to generate a further potential having a positive temperature coefficient, the latter potential then being added to the pn junction potential having a negative temperature coefficient to produce a reference voltage of substantially zero temperature coefficient. See for example U.S. Pat. No. 3,887,863 issued to A. P. Browkaw.

Standard CMOS integrated circuits make available parasitic npn bipolar transistors formed between the source-drain n+ regions, the p-well regions and the n-silicon substrate. Since the collectors of these parasitic transistors are all in the n-silicon substrate, these transistors can only be utilized in common-collector amplifier configurations. This prevents their being used to realize known reference voltage circuits.

First and second common-collector bipolar transistors formed with similar diffusion profiles are conditioned to conduct emitter currents that maintain their base-emitter junction current densities in a prescribed ratio. The difference in current density creates a $\Delta V_{BE}$ between their respective base-emitter potentials which potential is impressed across a first resistor to establish the current in the second transistor. Second and third resistors are connected to the emitter circuit of the [npn] bipolar transistors across which potentials are generated commensurate with the emitter current conducted by the transistors and having a positive temperature coefficient. The difference in potential across the second and third resistors is used to generate a further potential for maintaining the current conducted in said first and second transistors in a prescribed ratio. The potential across the second resistor in the emitter circuit of the first transistor is summed with the base-emitter potential of the first transistor producing a reference voltage substantially independent of temperature.

Figure 1:
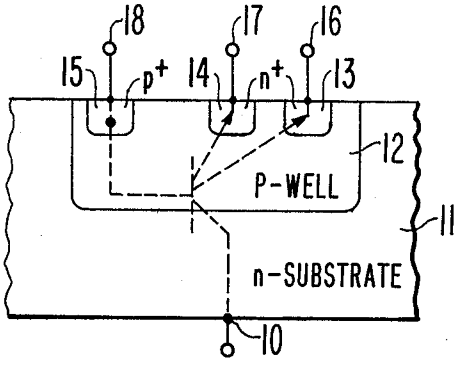
FIG. 1 is a cross section of a CMOS integrated circuit illustrating the component parts constituting the parasitic npn transistors.

Referring to the FIG. 1, there is shown a cross section of a portion of a typical CMOS integrated circuit including the impurity regions used to form an N-type MOS transistor. Substrate 11 in conventional CMOS devices is n-type material. P-type MOS transistors are fabricated directly in the n-type substrate, a consequence of which is that the substrate must be biased to a positive potential relative to other portions of the device. A connection 10 is provided for applying such bias. The n-type MOS transistors on the other hand are formed in p-type wells such as the region 12. The p-type well is of relatively light impurity concentration. Ohmic contact to the p-well 12 is effected via the p-type region 15 of relatively heavy impurity concentration. The impurity concentration of region 15 is the same concentration density as the drain and source regions of the P-type MOS transistors formed in the substrate. Potential bias is applied to p-well 12 through connection 18 such that 12 is maintained reverse-biased relative to substrate 11.

The n-type regions 13 and 14 are of relatively heavy impurity concentration used to form the drain and source regions of n-type transistors. The n-type substrate, p-type well and n-type drain diffusions are dimensionally related to create a parasitic npn bipolar transistor with the substrate as collector, p-well as base and n-type drain-source regions as emitters. The operational parameters of the parasitic npn transistors in a typical CMOS array have been found to be relatively uniform throughout a given array and of sufficient quality to reliably fabricate common collector amplifier circuits. It is noted that the npn transistors are relegated to common collector implementation since the substrate forms a common collector for all such parasitic transistors.

Figure 2:
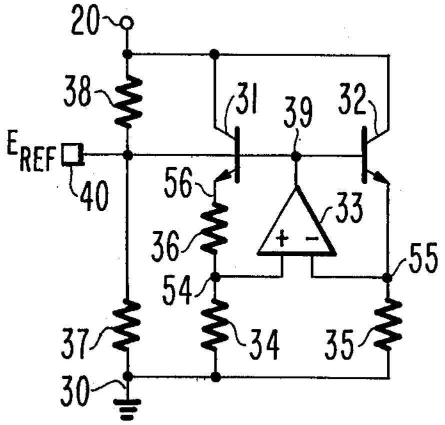

The availability of bipolar transistors on the CMOS array makes possible a bandgap type voltage reference. The FIG. 2 shows a bandgap voltage reference realized using two common-collector npn transistors 31 and 32. The collector of transistor 32 is connected to positive supply 20 and its emitter is connecter via resistor 35 to negative supply 30. Transistor 31 has its collector connected at positive supply 20 and its emitter connected to negative supply 30 via series-connected resistors 36 and 34. Voltage is applied to the base electrodes of transistors 31 and 32 from the output connection of a high-gain differential-input amplifier 33. Amplifier 33 has an inverting input connected at the emitter of transistor 32 and has a non-inverting input connected at the interconnection of resistors 34 and 36. A further resistor 38 is connected between supply 20 and base connection 39 and resistor 37 is connected between supply 30 and connection 39 for applying initializing current to the base connections of transistors 31 and 32.

The impedances of resistors 37 and 38 are large compared to the output impedance of amplifier 33.

The invention proceeds on the concept of developing a voltage having a positive temperature coefficient, (or TC), and combining it with a second voltage having a negative TC to produce a voltage having a desirable TC within the range of substantially zero TC.

The base-emitter potential of a npn transistor, e.g., transistor 32, provides the voltage having a negative TC. The positive TC voltage is developed across resistor 35 and added to the base-emitter potential $V_{BE}$ of transistor 32 providing a desired TC potential between base connection 39 and supply 30.

It is known that transistors having similar diffusion profiles exhibit differing base-emitter potentials in proportion to the current density at their emitter electrodes. The difference in base-emitter voltage $\Delta V_{BE}$ is given by $\Delta V_{BE}=(kT/g)\ln(J_2/J_1)$ (1) where T is absolute temperature, k is Boltzmans's constant, q is the charge of an electron, and $J_2/J_1$ is the ratio of the current densities of transistors 32 and 31 respectively. From Eq. (1) it is seen that the $\Delta V_{BE}$ has a positive TC. Impressing $\Delta V_{BE}$ across resistor 36 develops a current therethrough having a positive TC. This current, conducted in series resistor 34, develops a potential thereacross having an amplified positive TC.

Resistor 35 is selected to have the same resistance value as resistor 34. High gain voltage 33 senses the potential across resistors 34 and 35 to generate a drive potential at the base connections of transistors 31 and 32 such that the current times resistance across resistors 34 and 35 are equal. The higher the gain of amplifier 33 the more nearly the potentials across 35 and 34 match and the more nearly the emitter currents in transistors 31 and 32 are in the desired ratio. For matched currents the ratio of current densities $J_2/J_1$ is established by the ratio of their base-emitter junction areas. As a consequence the potential $\Delta V_{BE}$ is readily predicted.

That $\Delta V_{BE}$ is impressed across resistor 36 can be seen from the following. Amplifier 33 adjusts the base potentials of transistors 31 and 32 to conduct a requisite current to condition resistors 34 and 35 to exhibit like potentials at connections 54 and 55 respectively, thereby reducing the potential between its inverting and non-inverting input connections near to zero volts. In this condition the potential between connection 39 and 55 is the base-emitter potential $V_{BE32}$ of transistor 32. The potential between connections 39 and 56 is the base-emitter potential $V_{BE31}$ of transistor 31. But $V_{BE32}=V_{BE31}+\Delta V_{BE}$ and the potential between connections 39 and 55 equals the potential between connections 39 and 54. Therefore, the potential between connections 54 and 56 must equal $\Delta V_{BE}$.

The connection of the base-emitter circuit of transistor 32 from the output connection of amplifier 33 to its inverting input provides feedback to configure the amplifier as a voltage follower. Potential changes at connection 54 incident to the positive TC of $\Delta V_{BE}$ across resistor 36 are translated to node 55 creating an effective positive TC in resistor 35. Summing the positive TC across resistor 35 with the negative TC of the base-emitter junction of transistor 32 provides a potential at the base connection 39 having the desired TC.

In order for the positive and negative TC's to more nearly cancel the potential, $V_{R35}$, across resistor 35 and potential $V_{BE32}$ should sum to the band-gap voltage extrapolated to zero or approximately 1.20 volts.

The foregoing description provides for establishing a particular $\Delta V_{BE}$ by arranging transistors 31 and 32 to have their base-emitter junction areas in a particular ratio, and to conduct similar emitter currents. Alternatively the $\Delta V_{BE}$ potential can be realized by arranging transistors 31 and 32 to have equal area base-emitter junctions and to conduct emitter currents in a prescribed ratio. In the latter case the ratio of the resistances of resistor 34 to resistor 35 must be in the inverse ratio as the ratio of emitter currents of transistor 32 to transistor 31. This requirement conditions nodes 54 and 55 to exhibit like potentials when the emitter currents are in the proper ratio.

By way of example, arranging the ratio of current densities of transistors 32 and 31 to be 10:1, resistors 34 and 35 to equal 6200 ohms and resistor 36 to equal 600 ohms will produce an output voltage of 1.2 volts for a $V_{BE}$ of 0.58 volts at 1 ma.

The amplifier 33 is presumed to be relatively high gain. For the embodiment shown the potential difference between points 54 and 55 is approximately 1 mV for the amplifier having a gain of 1000 times. This guarantees that the positive TC potential at point 54 is faithfully translated to point 55. Voltage gains of 1000 and greater are easily realized in integrated amplifiers.

Though the invention can be totally integrated, the resistors may be external to the monolithic die. In this case resistor 34 or 35 can be replaced with a potentiometer to allow for trimming the currents. Resistor 34 also may be replaced with an adjustable resistance to permit adjusting the value of the emitter currents. The resistors 34 and 35 and transistors 31 and 32 must be arranged for close thermal coupling to insure they track each other.

Figure 3:
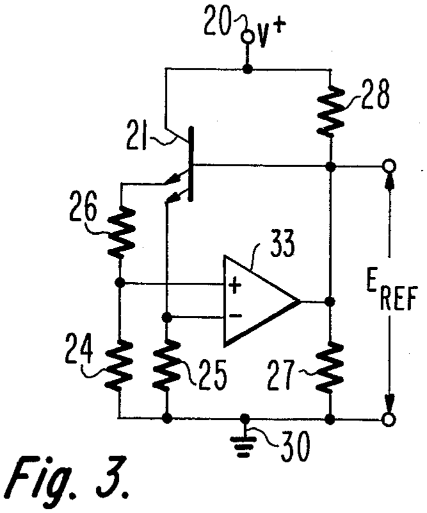
FIGS. 2 and 3 are schematic diagrams embodying voltage references for generating reference voltage substantially equal to band gap voltage.

The FIG. 3 circuit illustrates a version of the FIG. 2 circuit wherein the transistors 31 and 32 are subsumed into a single transistor 21 having two emitter electrodes. The two emitter structure provides better thermal tracking of the currents through the two legs of the circuit especially if the larger junction is formed concentrically about the smaller. Sharing the same p-well for a base region, the two effective transistors should be electrically matched except for their operating current densities. Operation of the FIG. 3 circuit is the same as that of the FIG. 2 circuit. Transistor 21 could be, for example, of the type shown in FIG. 1.

Figure 4:
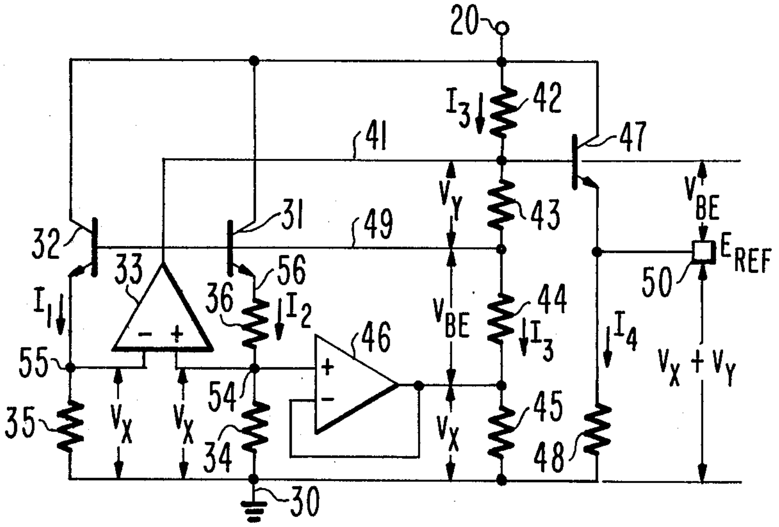
FIG. 4 is a schematic diagram of an embodiment of the invention for generating reference voltages greater or lesser than a band gap voltage.

The operation of the FIG. 4 circuit depends on similar concepts as the operation of the FIG. 2 and 3 circuits with the exception that a portion of the negative base-emitter TC of transistor 32 is summed with a positive TC in the series resistor string 42, 43, 44 and 45 to produce a zero TC voltage buffered by the emitter follower including transistor 47 and resistor 48.

In the FIG. 4 circuit, amplifier 33 does not connect directly to the base connections of transistors 31 and 32 but connects through resistor 43. Resistor 43 is serially connected with resistors 42, 44 and 45 between supply terminals 20 and 30. A second amplifier 46, having a non-inverting unity gain transfer function, translates the potential at node 54 having a positive TC and designated $V_X$, to the interconnection of resistors 44 and 45. The potential across resistor 44 is thereby constrained to equal the potential $V_{BE32}$ across the base-emitter junction of transistor 32 which potential develops current $I_3$ through resistor 44 equal to $V_{BE32}/R_{44}$, where R44 is the resistance value of resistor 44. A potential change in $V_{BE32}$ causes a corresponding change in current $I_3$. By virtue of the series connection of resistors 44 and 43, a change in current $I_3$ through resistor 44 produces a proportional change in potential $V_Y$ across resistor 43. The proportional change $\Delta V_Y / \Delta V_{BE32}$ is equal to the ratio of resistances R43:R44. Consequently, a change in $V_{BE32}$ due to its negative TC effects a proportional change in the potential $V_Y$. The resistor 43 is selected to produce a desired voltage, and the ratio R43:R44 is selected so that $$(R34/R36)d(\Delta V_{BE})/dT=(R43/R44)d(V_{BE})/dT \quad (2)$$

and the effective negative TC of $V_Y$ will cancel the effective positive TC of $V_X$. Summing the potentials across resistors 43, 44 and 45, the potential at the base of transistor 47 at interconnection 41 is $V_X+V_{BE}+V_Y$ with only $V_{BE}$ contributing a TC.

The potential at the base of transistor 47 is translated via emitter-follower action to the output connection 50 less the base-emitter junction voltage of 47. The resultant potential, $E_{ref}$, at 50 equals $V_X+V_Y$. If transistor 47 is formed similarly to transistor 32 and it is conditioned to pass a similar current to transistor 32 then its base-emitter TC will cancel the TC contribution of $V_{BE32}$ present at its base connection.

It can be shown that the output potential is given by $$E_{ref}=(R34/R36)\left(\Delta V_{BE}+\frac{d(\Delta V_{BE})}{d(V_{BE})}\right) \quad (3)$$

where R34 and R36 are the respective resistance values of resistors 34 and 36 and $d(\Delta V_{BE})/dV_{BE}$ is the derivative of $\Delta V_{BE}$ with respect to $V_{BE}$. Once the emitter currents $I_1$ and $I_2$ and the ratio of current densities in transistors 32 and 31 are established, then the output potential is determined by selection of resistor 34. The values of resistors 43 and 44 remain in a fixed ratio. Thus a reference voltage having substantially zero TC can be established over a relatively wide range of values.

To meet the criterion that transistor 47 conduct similar current to transistor 32 the emitter resistor 48 should be $$R48=R35\left(1+\frac{1}{\Delta V_{BE}}\,\frac{d(\Delta V_{BE})}{d(V_{BE})}\right) \quad (4)$$

The two resistors 42 and 45 are included in the circuit to insure proper starting of the circuit when power is applied. Since amplifiers 33 and 46 both are presumed to have relatively low output impedance they override these resistors once the circuit is activated.

In the FIG. 4 circuit resistors 43 and 44, resistors 34, 35 and 48 and transistors 31, 32 and 47 should be arranged to insure thermal coupling of the respective elements in order to realize the best performance.

Figure 5:
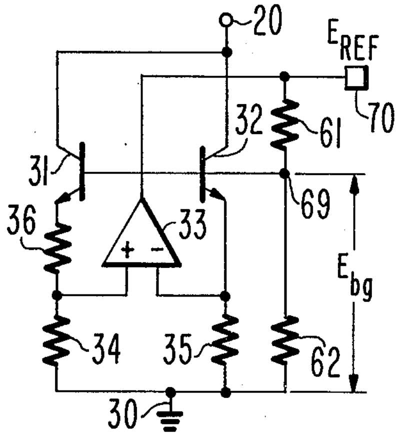
FIG. 5 is a schematic of a voltage reference for generating reference voltages greater than the band-gap voltage embodying the present invention.

The circuit of FIG. 5 produces a reference voltage greater than band-gap reference voltage by multiplying the band-gap voltage available at the base electrodes of transistors 31 and 32 as per the FIG. 2 circuit. Assuming base currents to be negligible, current conducted in resistor 62 is $E_{bg}$/R62 where R62 is the resistance of resistor 62. The potential $E_{ref}$ is equal to $E_{bg}$ plus the potential drop across resistor 61 by virtue of the current $E_{bg}$/R62, or $$E_{ref}=E_{bg}(1+R61/R62)$$

The foregoing embodiments are applicable to circuits of discreet and integrated form, providing the devices are maintained in adequate thermal conformity. One skilled in the art of reference circuits and armed with the foregoing will readily be able to conceive of variations on the invention without straying from the spirit of the invention and the claims should be construed in this light.

What I claim is:

1. A reference voltage circuit comprising:

first and second common-collector amplifier transistors of the same conductivity type having respective base electrodes respectively connected to a first node, having respective emitter electrodes and respective base-emitter junctions;

first, second and third resistive means each having a respective first end and a respective second end; the first ends of said first and second resistive means connected to a common potential, the second ends of said first and third resistive means connected to the respective emitter electrodes of the first and second transistor respectively, and the first end of the third resistive means connected at the second end of the second resistive means;

a differential-input amplifier having inverting and non-inverting input connections connected for receiving respective potentials from the second ends of said first and second resistive means, and having an output connection, said differential input amplifier for providing at its output connection an amplified response to a potential difference across its input connections; and means connecting the output connection of the differential-input amplifier to the first node to complete a direct coupled feedback loop, said feedback loop functioning to condition said first and second transistors to maintain the density of current in their base-emitter junctions in a prescribed ratio.

2. A reference voltage circuit comprising:

a common-collector amplifier transistor having a base electrode connected to a first node, having first and second emitter electrodes and first and second base-emitter junctions;

first, second and third resistive means each having a respective first and second end, the first ends of said first and second resistive means connected to a common potential, the second ends of said first and third resistive means connected to the first and second emitter electrodes respectively, and the first end of the third resistive means connected at the second end of the second resistive means;

a differential-input amplifier having inverting and non-inverting input connections connected for receiving respective potentials from the second ends of said first and second resistive means, and having an output connection, said differential-input amplifier for providing at its output connection an amplified response to a potential difference across its input connection; and means connecting the output connection of the differential-input amplifier to the first node to complete a direct coupled feedback loop, said feedback loop functioning to condition said transistor to maintain the density of current in the first and second base-emitter junctions in a prescribed ratio.

3. A reference voltage circuit comprising:

a CMOS integrated circuit formed in a monolithic substrate having first and second parasitic bipolar transistors each having respective collector regions common to the monolithic substrate material, having respective base regions formed by wells of opposite conductivity type material to the substrate disposed in the surface of substrate, having emitter regions of like conductivity type to the substrate disposed at the surface of said wells with base-emitter junctions therebetween and respective collector, base and emitter electrodes for making ohmic contact to the respective collector, base and emitter regions respectively, the first and second transistors connected as common-collector amplifiers with their respective base electrodes connected to a first node;

first, second and third resistive means each having a respective first end and a respective second end; the first ends of said first and second resistive means connected to a common potential, the second ends of said first and third resistive means connected to the respective emitter electrodes of the first and second transistors respectively, and the first end of the third resistive means connected at the second end of the second resistive means;

a differential-input amplifier having inverting and non-inverting input connections connected for receiving respective potentials from the second ends of said first and second resistive means, and having an output connection, said differential input amplifier for providing at its output connection an amplified response to a potential difference across its input connections; and means connecting the output connection of the differential-input amplifier to the first node to complete a direct coupled feedback loop, said feedback loop functioning to condition said first and second transistors to maintain the density of current in their base-emitter junctions in a prescribed ratio.

4. A reference voltage circuit as set forth in claim 1, wherein the resistances of the second and third resistive means are chosen in such ratio that a substantially zero-temperature coefficient voltage is maintained at said first node.

5. A reference voltage circuit as set forth in claims 1, 2 or 3 wherein the means connecting the output connection of the differential input amplifier to the first node comprises a direct connection without substantial intervening impedance.

6. A voltage reference circuit as set forth in claims 1, 2 or 3 wherein the means connecting the output connection of the differential-input amplifier to the first node comprises a resistor-divider circuit connected between the amplifier output connection and the common potential, said resistor-divider having an output terminal connected to said first node to apply a portion of the potential available from said amplifier thereto.

7. A reference voltage circuit as set forth in claims 1, 2 or 3 wherein said means connecting the output connection of the differential input amplifier to the first node comprises fourth resistive means; and wherein said reference voltage circuit further comprises:

further amplifier means having an input connection at the non-inverting input connection of the differential-input amplifier and having an output connection, said further amplifier means exhibiting a substantially unity-gain, non-inverting transfer function;

fifth resistive means connected between the first node and the output connection of the further amplifier means; and means connected to the output connection of the differential-input amplifier from which a substantially temperature insensitive voltage is available including:

sixth resistive means having a first end connected to the common potential and having a second end at which point the temperature insensitive voltage is available; and a pn junction having voltage-temperature characteristics and forward offset potential similar to the base-emitter junction of the first transistor, having a first end connected at said amplifier output connection and having a second end connected at the second end of the sixth resistor, said pn junction being poled to be normally forward conducting.

8. A reference voltage circuit as set forth in claim 7 wherein:

the forward potential of the base-emitter junction serially connected with the first resistive means is $V_{BE}$;

a difference in forward base-emitter junction potentials due to the prescribed ratio of current densities is $\Delta V_{BE}$;

the resistance values of the second, third, fourth, fifth and sixth resistive means are respectively R2, R3, R4, R5, R6;

the ratio of R4:R5 is equal to $$(R2/R3)\left(\frac{\partial(\Delta V_{BE})}{\partial T} \Big/ \frac{\partial(V_{be})}{\partial T}\right)$$

and the substantially temperature insensitive output voltage $E_{ref}$ is given by $$E_{ref} = (R2/R3)\ (\Delta V_{BE} + \partial(\Delta V_{BE})/\partial V_{BE}).$$

* * * * *

UNITED STATES PATENT AND TRADEMARK OFFICE
CERTIFICATE OF CORRECTION

PATENT NO. : 4,263,519

DATED : April 21, 1981

INVENTOR(S) : Otto Heinrich Schade, Jr.

It is certified that error appears in the above—identified patent and that said Letters Patent is hereby corrected as shown below:

| | | |
|---|---|---|
| Column 2, Line 58 | - | "connecter" should be -- connected -- ; |
| Column 3, Line 21 | - | "$\Delta V_{BE} = (kT/g) \ln (J_2/J_1)$" should be -- $\Delta V_{BE} = (kT/q) \ln (J_2/J_1)$ -- ; |
| Column 3, Line 31 | - | after "voltage" insert -- amplifier -- ; and |
| Column 6, Line 2 | - | after the equation, insert at the end of line 2 -- (5) -- to number the equation. |

Signed and Sealed this

*Tenth* Day of *November 1981*

[SEAL]

*Attest:*

GERALD J. MOSSINGHOFF

*Attesting Officer* *Commissioner of Patents and Trademarks*